United States Patent
Joshi

(10) Patent No.: US 9,245,625 B2
(45) Date of Patent: Jan. 26, 2016

(54) LOW POWER SIGNALING FOR DATA TRANSFER

(71) Applicant: Broadcom Corporation, Irvine, CA (US)

(72) Inventor: Sachin Joshi, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 554 days.

(21) Appl. No.: 13/627,590

(22) Filed: Sep. 26, 2012

(65) Prior Publication Data

US 2014/0089550 A1  Mar. 27, 2014

(51) Int. Cl.
*G06F 13/28* (2006.01)
*G11C 15/00* (2006.01)
*G11C 7/10* (2006.01)

(52) U.S. Cl.
CPC .............. *G11C 15/00* (2013.01); *G11C 7/1006* (2013.01); *G11C 2211/5647* (2013.01)

(58) Field of Classification Search
CPC ... G06F 13/4217; G11C 7/1006; G11C 15/00
See application file for complete search history.

(56) References Cited

U.S. PATENT DOCUMENTS

| | | | |
|---|---|---|---|
| 6,553,445 B1* | 4/2003 | Drapkin et al. | 710/305 |
| 2003/0099300 A1* | 5/2003 | Anders et al. | 375/259 |
| 2004/0068594 A1* | 4/2004 | Asaro et al. | 710/104 |
| 2005/0132112 A1* | 6/2005 | Pawlowski | 710/110 |
| 2009/0089557 A1* | 4/2009 | Luo et al. | 712/224 |
| 2009/0182918 A1* | 7/2009 | Hollis | 710/106 |

* cited by examiner

*Primary Examiner* — Nimesh G Patel
(74) *Attorney, Agent, or Firm* — Sterne, Kessler, Goldstein & Fox P.L.L.C.

(57) ABSTRACT

Methods, systems and computer readable storage medium embodiments for communicating over a data bus include, determining a number of changes in bit value in respective bit positions between a previous bit string and a current bit string, transmitting either the current bit string in an inverted form over the data bus if the determined number of changes in bit value exceeds a threshold or the current bit string in non-inverted form if the determined number of changes in bit value does not exceed a threshold, and transmitting an additional at least one bit along with the current bit string having a logic value that indicates whether the current bit string is in an inverted form or non-inverted form. Methods, systems, and computer readable storage medium embodiments for receiving bit strings over a bus are also disclosed.

13 Claims, 8 Drawing Sheets

LOW POWER SIGNALING FOR DATA TRANSFER

BACKGROUND

1. Field of the Invention

Embodiments of this invention are related generally to the transfer of data, and more particularly to reducing power consumption during the transfer of data.

2. Background Art

As computer systems keep getting faster and their use increases, the power consumption of computer systems have become a concern. The increases in processing power, as well as improvements in accessing data contribute to this increase in power consumption. For example, content addressable memories (CAM), which consume significantly higher amounts of power than many other memory access techniques, are frequently used in modern computing systems to speed up access to data.

Thus, the reduction of power consumption in computing systems is of increasing importance. Power savings have been sought by optimizing any of several components in a computer system, such as the processor(s), memories, display devices, peripheral devices, and the like. Moreover, power savings are also sought in one or more buses that transmit data and control signals. For example, power savings have been sought by reducing the amount of data transferred (e.g. reduce the number of bits/bytes transferred) over a bus, and by turning the bus components off when not in use.

The power consumption in computer systems has greatly improved over the last few years. However, further reductions in power consumption during data transmission are desired.

BRIEF SUMMARY

Embodiments are directed to utilizing known characteristics of the previously transmitted bit string when transmitting a new bit string in order to reduce the amount of power expended in transmitting the new bit string.

Methods, systems and computer readable storage medium embodiments for communicating over a data bus include, determining a number of changes in bit value in respective bit positions between a previous bit string and a current bit string, transmitting either the current bit string in an inverted form over the data bus if the determined number of changes in bit value exceeds a threshold or the current bit string in non-inverted form if the determined number of changes in bit value does not exceed a threshold, and transmitting an additional at least one bit along with the current bit string having a logic value that indicates whether the current bit string is in an inverted form or non-inverted form.

Methods, systems and computer readable storage medium embodiments for receiving data over a data bus include receiving a current bit string over the data bus along with an additional at least one bit associated with the current bit string, determining whether the received current bit string is in an inverted form based upon a logic value of the received additional at least one bit, and inverting the received current bit string if the received current bit string is in an inverted form according to the determining.

Further features and advantages of the present disclosure, as well as the structure and operation of various embodiments thereof, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Reference will be made to the embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE INVENTION

While the present disclosure is described herein with reference to illustrative embodiments for particular applications, it should be understood that the invention is not limited thereto. Those skilled in the art with access to the teachings herein will recognize additional modifications, applications, and embodiments within the scope thereof and additional fields in which the invention would be of significant utility.

In accordance with the teachings in this disclosure, a new signal is transmitted based upon one or more previously transmitted signals and the receiver is provided with information to enable it to generate the new signal from the earlier signals. Embodiments provide for transmitting two or more values with reduced power consumption. Characteristics of the bit string representing an earlier transmitted value is used in order to encode and transmit another value in a manner that reduces the consumed power. The power consumed during transmission is reduced by minimizing the number of transitions made by the transmitter in sending each bit string. The transitions are minimized by transmitting, for respective bit strings, either the bit string in its original form or in the form of a corresponding inverted bit string.

Figure 1:
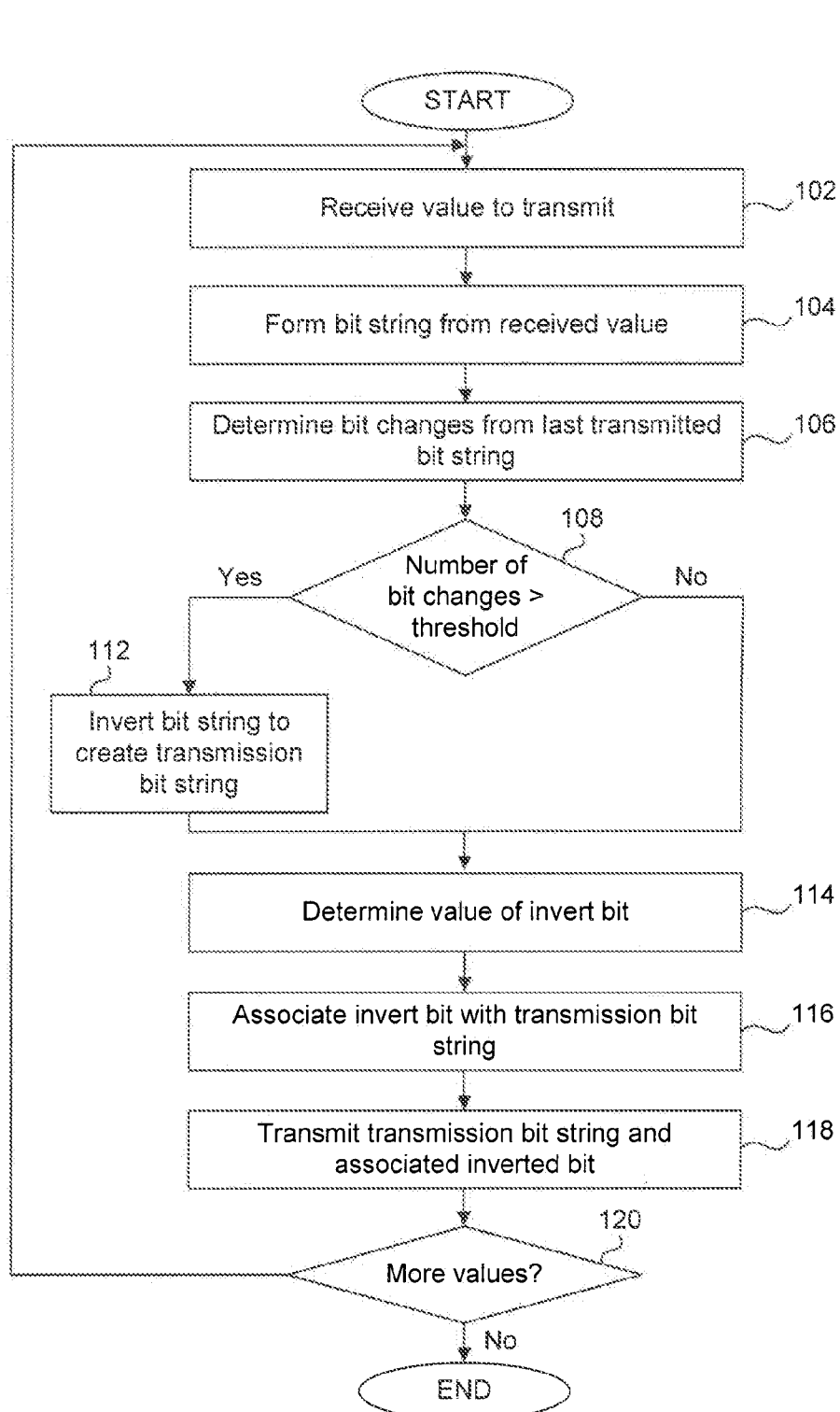
FIG. 1 illustrates a method for transmitting consecutive bit strings, in accordance with an embodiment.

FIG. 1 illustrates a method 100 for transmitting consecutive bit strings, in accordance with an embodiment, that may be transmitted for example over a bus. In embodiments, method 100 may be performed with steps 102-120 in the order shown, or in another order. In some embodiments, one or more of steps 102-120 may not be performed.

At step 102, a transmitting module receives a value to be transmitted. According to an embodiment, the value may be received from a memory and/or register.

At step 104, a bit representation (which may be referred to as a "bit string" or as a "bit sequence") for the received value is determined. In many embodiments, the determined bit representation is the default bit representation in which the value is received at step 102. In some representations, however, the determined bit representation may differ from the form in which the value was received. For example, the determined bit representation may require a larger number of bits than the received form, and may require one or more pad bits. According to an embodiment, the determined bit representation has a number of bits that corresponds to one less than the number of lanes (also referred to as "lines" or "bus lines") in the parallel bus in which the value is to be transmitted. For ease of description, the bit string corresponding to the last received value is referred to as the "current bit string."

At step 106, changes in the current bit string is compared to the bit string that was last transmitted. The "previous bit string" is the bit string that was most recently transmitted before the current bit string. More specifically, the previous bit string is the bit string that was last transmitted over the same bus on which the current bit string is to be transmitted. The comparison includes comparing the values (i.e. bit values, also referred to as logic values of bits) of respective bit positions in the previous bit string to corresponding bit values in the current bit string, in order to identify the bit positions at which the bit value in the current bit string is different from the corresponding bit value in the previous bit string.

For example, if the previous bit string is "0000000" and the current bit string is "1111111", then the comparison would yield that 7 bits (or bit positions) have transitioned (e.g. changed in bit value) between the previous and current bit strings. If the previous bit string was "11010011" and the current bit string is "11001011", then the number of bit positions that have changed is 2. Specifically, bit positions 4 and 5 have changed between the previous and current bit strings (considering the left most bit to be at bit position 1). Note that a change in the bit value at a particular bit position refers to the value of a bit in that position changing from 0 to a 1, or vice versa, between the previous bit string and the current bit string. The comparison allows determining the number of bits that have changed between the previous and current bit strings.

At step 108, it is determined whether the number of bits that have changed between the previous and the current bit strings exceeds a threshold. The threshold may be previously configured, or may be dynamically determined. According to one example, the threshold is N/2, where N is the number of bits in a bit string. Thus, in the above examples, where the bit strings were 7 bits long, the threshold is exceeded at 4 bit changes. By setting the threshold at N/2, the number of changes in the value of bits between any two consecutively transmitted bit strings is limited to a maximum of N/2. Therefore, the power consumption due to charging and discharging capacitors for the transmission of values over the bus is limited to a maximum of N/2 bit transitions for each bit string.

If, at step 108, it is determined that the number of bit changes exceed the threshold, then at step 112, the current bit string is inverted by inverting each bit in the bit string. For example, inverting the bit string "1101010" would yield the bit string "0010101" where each 0 in the non-inverted current bit string is a 1 in the inverted current bit string, and each 1 in the non-inverted current bit string is a 0 in the inverted current bit string.

Moreover, a value for an additional bit referred to herein as an "invert bit," is determined at step 114. The invert bit indicates to the receiver whether the bit string associated with the invert bit is inverted or not. According to an embodiment, if the current bit string is inverted at step 112, then the invert bit is set to 1. In the same embodiment, if the current bit string is not inverted (e.g. determined that the number of bit value changes is not greater than the threshold at step 108), then the invert bit is set to 0.

At step 116, the invert bit is associated with the current bit string so that the associated invert bit can be transmitted along with the current bit string. For example, by associating the invert bit with the 7 bit current bit string, an 8 bit transmission bit string is formed.

At step 118, the transmission bit string (e.g., whether inverted or original) and the associated invert bit are transmitted. According to an embodiment, the bit string is transmitted over a parallel bus (e.g. a data bus having a plurality of lanes to concurrently transmit bits). The parallel bus may include n+1 parallel transmission lanes, where n represents the number of bits in the bit string prior to adding the invert bit. For example, for bit string having 7 bits, the parallel bus includes 8 parallel transmission lanes so that the 7 bits from the transmission bit string as well as the associated invert bit are transmitted concurrently over the parallel bus.

At step 120, it is determined whether more values have been (or are expected) to be received. If "yes", then method 100 returns to step 102 to receive the next value. If "no", then method 100 terminates.

Figure 4:
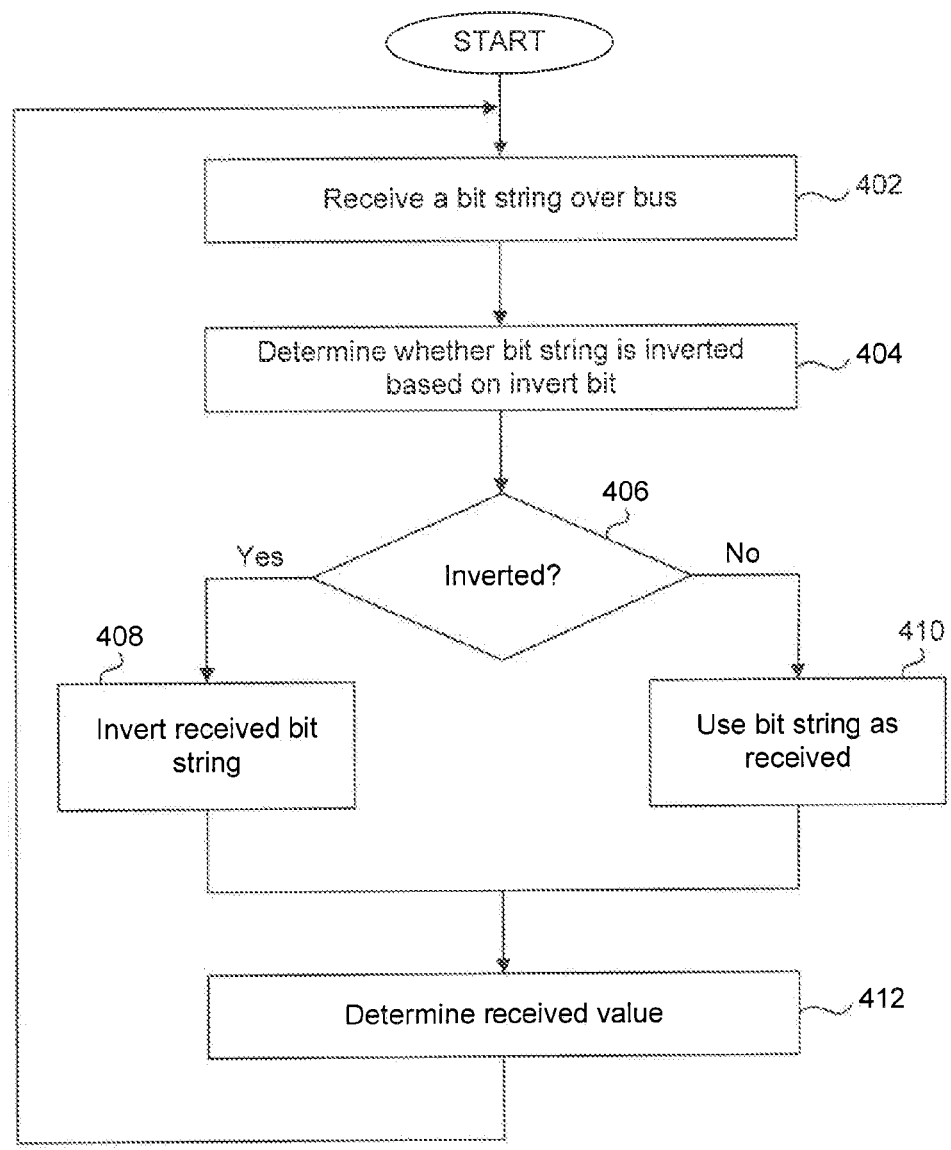
FIG. 4 illustrates a method for receiving a bit string, in accordance with an embodiment.

Method 100 may be performed by a transmitter when transmitting a series of values over a parallel bus to a receiver, such as a receiver performing a method illustrated in FIG. 4. Any series of values can be transmitted using method 100. By transmitting either an inverted bit string or an un-inverted bit string based on the number of changes in the values of bit positions between two consecutive bit strings, the amount of charging and discharging of capacitors performed in the actual transmission is reduced, thereby resulting in power savings at the transmitter. Likewise, the power consumption at the receiver may also be reduced because the changes in bit values between consecutively received bit strings are reduced.

Accordingly, the above described technique of data transmission results in power savings when compared to conventional techniques, and may be applied to several different types of data distribution topology. For example, embodiments yield power savings in one-to-one and one-to-many data distribution topologies. An exemplary one-to-many data distribution topology in which the present embodiments may be particularly advantageous is described below in relation to FIG. 6.

Figure 2:
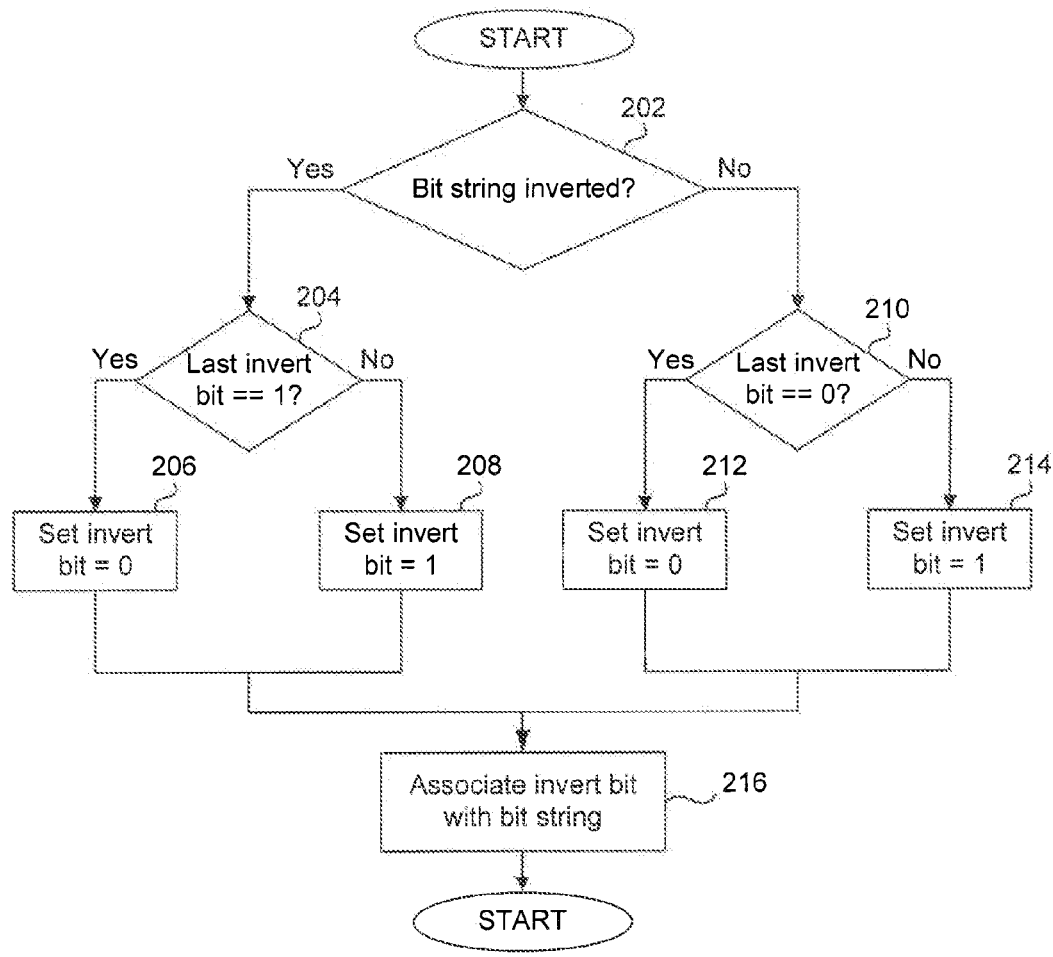
FIG. 2 illustrates a method of determining an invert bit to be transmitted, in accordance with an embodiment.

FIG. 2 illustrates a method 200 for dynamically determining an invert bit based on the comparison of the current bit string with the previous bit sting, in accordance with an embodiment. In an embodiment, method 200 may be performed with steps 202-216 in the order shown, or in another order. In some embodiments, one or more of steps 202-216 may not be performed. According to an embodiment, method 200 may be used in performing step 116 described above.

At step 202, it is determined whether the current bit string is inverted. The term "associated invert bit" refers to the invert bit that is being considered for transmission concurrently with the current bit string. When, for example, as in step 108 described above, it is determined whether to invert a current bit string or not, an indication as to that decision can be communicated to any module that performs method 200.

If, at step 202, it is determined that the current bit string is inverted, then at step 204, the value of the invert bit associated with the previous bit string is determined. If the previous bit string's invert bit was set to 1, then, at step 206, the invert bit of the current bit string is set to 0. If the previous bit string's invert bit was not set to 1 (i.e. set to 0), then, at step 208, the invert bit of the current bit string is set to 1. In effect, when the current bit string is inverted with respect to the previous bit string, then the current invert bit is also inverted (or flipped) with regard to the previous invert bit.

If, at step 202, it is determined that the current bit string is not inverted, then at step 210, the value of the invert bit associated with the previous bit string is determined. If the previous bit string's invert bit was set to 0, then, at step 212, the invert bit of the current bit string is set to 0. If the previous bit string's invert bit was not set to 0 (i.e. set to 1), then, at step 214, the invert bit of the current bit string is set to 1. In effect, when the current bit string is not inverted, then the current invert bit is not inverted with regard to the previous invert bit. Stated another way, when the current bit string is not inverted, then the current invert bit has the same logic value as the previous invert bit.

From, any of steps 206, 208, 212, or 214, method 200 continues to step 216, where the current invert bit is associated with the current bit string. The current bit string accompanied by the current invert bit may be referred to as a current transmission bit string.

Method 200 further utilizing the relationship between consecutive bit strings in order to lower the power consumed in transmission of the data strings and associated other bits, by minimizing the transitions of the transmitter required in transmitting the successive invert bits.

Figure 3:
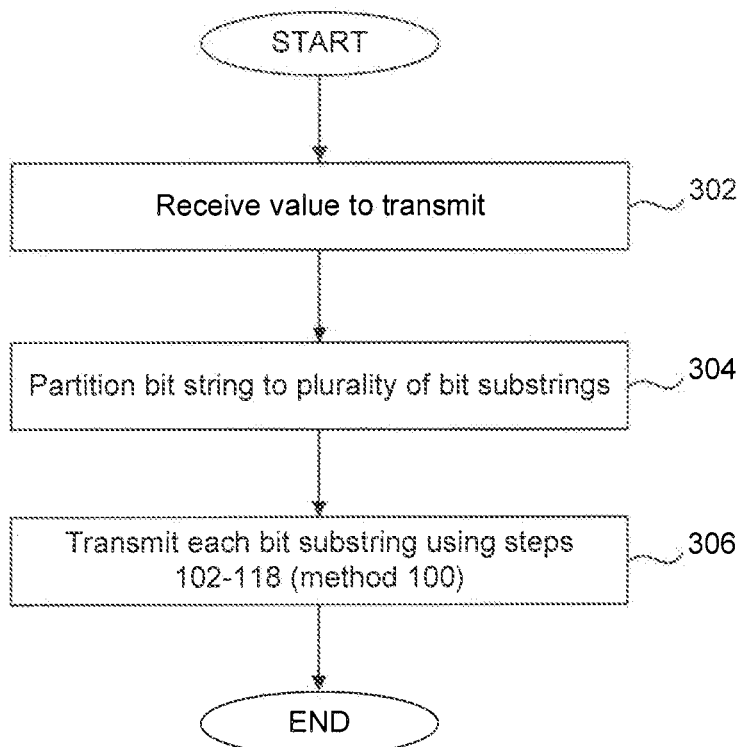
FIG. 3 illustrates a method for transmitting a wide bit string, in accordance with an embodiment.

FIG. 3 illustrates a method 300 for transmitting a wide bit string, in accordance with an embodiment. In embodiments, method 300 may be performed with steps 302-306 in the order shown, or in another order. In some embodiments, one or more of steps 302-306 may not be performed. According to an embodiment, method 300 may be utilized in performing method 100 in order to transmit bit strings that are wider than the parallel bus.

At step 302, a value to be transmitted is received and the corresponding bit representation is determined. The value to be transmitted can be received from a memory and/or register.

At step 304, the bit string representing the received value is partitioned to a plurality of bit substrings. The size in bits (e.g. number of bits) of each substring may be determined based upon the number of lanes in the transmission bus over which bits can be transmitted in parallel. Further, the size of the sub strings can be determined based upon how many bits are to be transmitted as invert bits. According to an embodiment, the received value, which is in the form of a 128-bit integer, is partitioned to seventeen 7-bit bit substrings. In this example embodiment, the size of the bit string may be determined to be 1 less than the number of parallel lanes in the transmission bus. For example, the parallel bus may have 8 lanes, and the hit string has 7-bits. The remaining lane in the parallel bus may be reserved for transmission of one invert hit with each bit substring. A person skilled in the art would appreciate that the partitioning of the bit string to a plurality of bit subs strings can be performed in any of several techniques to yield some number of bit substrings.

At step 306, each bit substring is transmitted as described in relation to steps 106-120 described above. The result is that the substrings are transmitted as a sequence of respective substrings (each associated with its own invert bit), so that each bit substring is transmitted utilizing that substrings corresponding aspects with respect to the immediate preceding transmitted bit substring, in order to reduce power consumption. Thus, although transmitting the bit string as a plurality of bit substrings involves sending an invert bit with each substring, the switching penalty is reduced.

FIG. 4 illustrates a method 400 for receiving a bit string, in accordance with an embodiment. In embodiments, method 400 may be performed with steps 402-412 in the order shown, or in another order. In some embodiments, one or more steps 402-412 may not be performed. According to an embodiment, method 400 is used by a receiver to receive one or more bit strings or sub-strings being transmitted from a transmitter operating according to method 100 described above.

At step 402, a bit string is received. According to an embodiment, the bit string is received at a receiver over a parallel bus.

At step 404, it is determined whether the received bit string is an inverted bit string. This determination may be based upon an invert bit associated with the received bit string. In an example embodiment, the receiver receives an 8-bit wide bit string over the parallel bus. The 8-bits include 7-bits of data and 1 invert bit.

According to an embodiment, if the invert bit is 1, then the received bit string is an inverted bit string. For example, the received bit string may have been produced by the transmitter inverting the bit string that corresponds to the actual value that is communicated from the transmitter to the receiver.

At step 406, if the received bit string is an inverted bit string, then method 400 continues to step 408. If the received bit string is an inverted bit string, then at step 408, the received bit string is inverted again. Inverting the received bit string at the receiver would entail the same or similar processing steps performed by the transmitter to invert the bit string, i.e. flipping the value of each bit position from 0 to 1 or vice versa.

If, at step 406, the received bit string is not an inverted bit string, then method 400 continues to step 410. At step 410, the received bit string will continue to be considered in the form received (e.g., no invert operation is performed on the received bit string).

Method 400 reaches step 412 from either step 408 or step 410. At step 412, the received value is determined based upon the received bit string subsequent to processing at step 408 or 410. For example, the binary representation of the bit string is converted to a numerical value.

Figure 5:
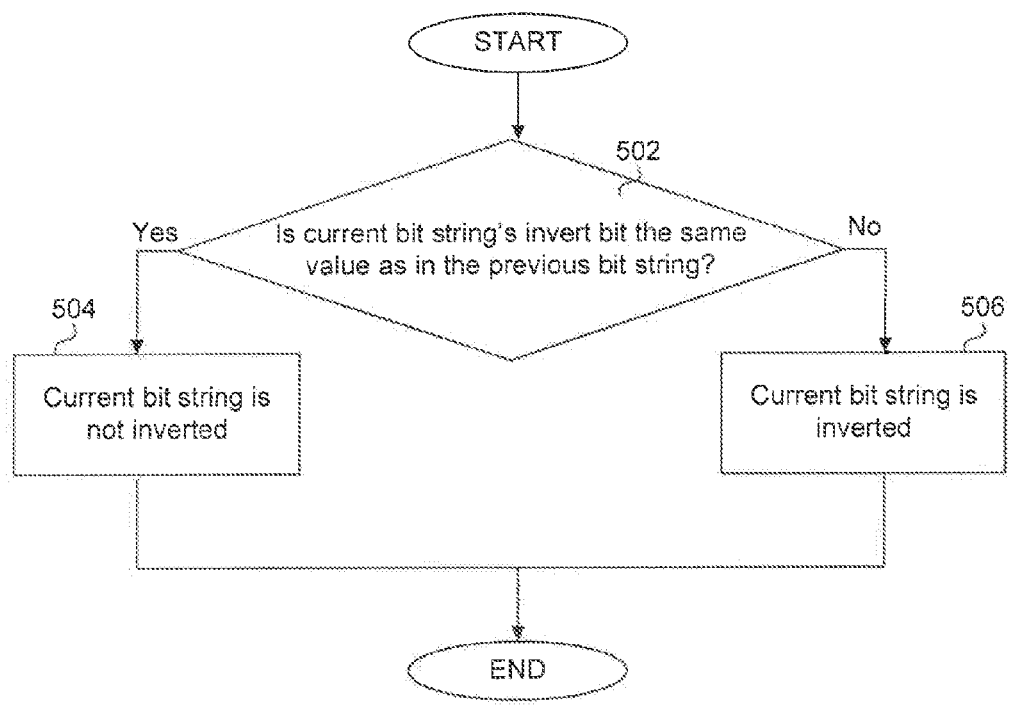
FIG. 5 illustrates a method for determining whether a received bit string is an inverted bit string, in accordance with an embodiment.

FIG. 5 illustrates a method 500 for determining whether a received bit string is an inverted bit string, in accordance with an embodiment. In embodiments, method 500 may be performed with steps 502-506 in the order shown, or in another order. In some embodiments, one or more steps 502-506 may not be performed.

According to an embodiment, method 500 is used by a receiver to determine whether a received bit string that is transmitted from a transmitter operating according to method 200 described above, is an inverted bit string. For example, method 500 may be used in performing step 404.

At step 502, it is determined whether the invert bit of the latest received bit string has the same value as the last received bit string. This determination may be based upon a comparison of the invert bit associated with the latest received bit string, with the invert bit of the immediately previous bit string which is maintained in a register or other memory. If "yes", then at step 504, it is determined that the received bit string is not an inverted bit string. If, at step 502, it is determined that the latest invert bit is not the same as the previous invert bit, then, at step 506, it is determined that the latest received bit string is an inverted bit string.

Further processing of the received bit string may be performed based upon whether the received string has been inverted or not, for example, as described in relation to step 404-406 of FIG. 4 above.

Figure 6:
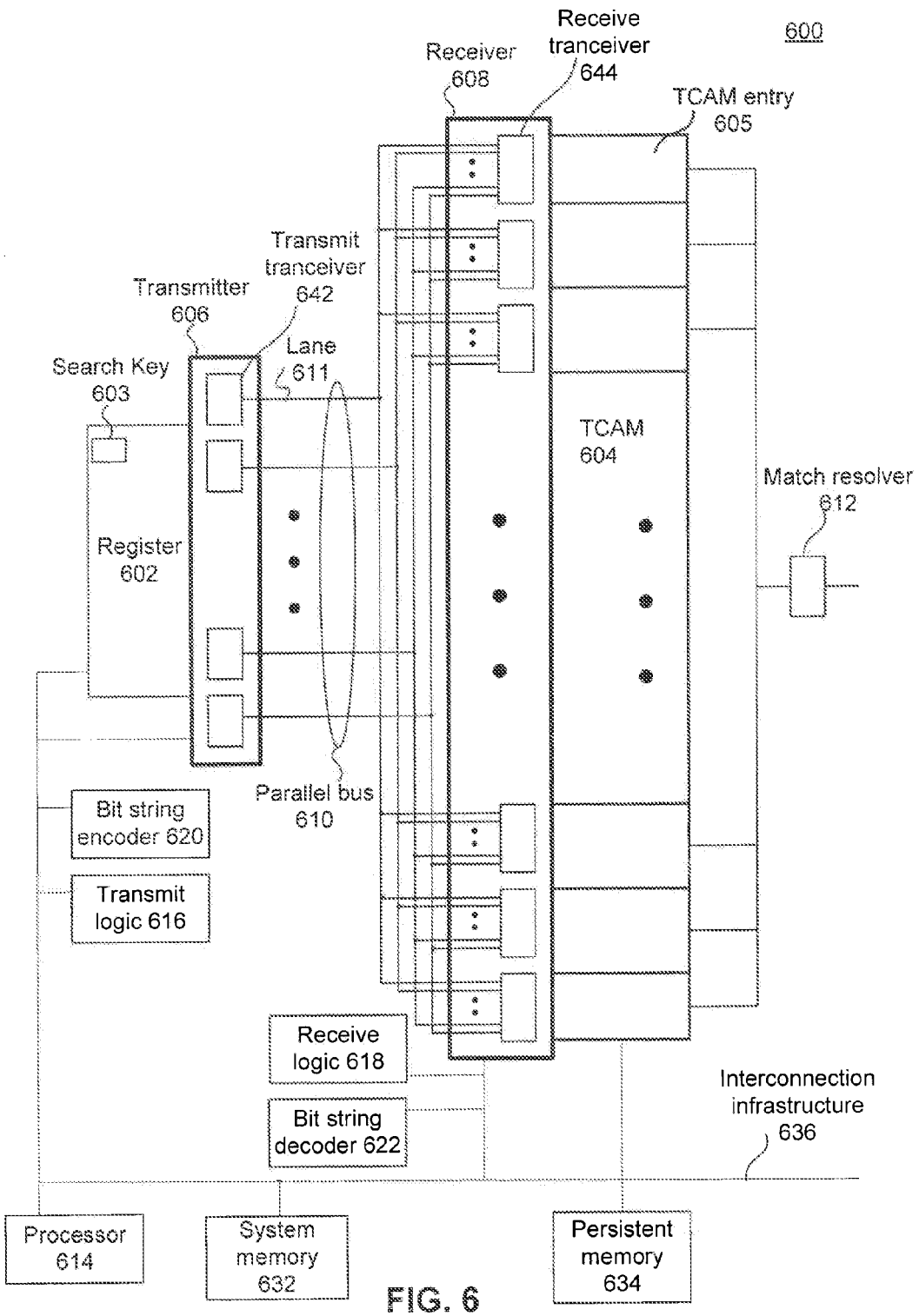
FIG. 6 illustrates a content addressable memory, in accordance with an embodiment.

FIG. 6 illustrates a system 600 having a ternary content addressable memory (TCAM), in accordance with an embodiment. System 600 may be included in any computer system.

System 600 includes a TCAM 604. A TCAM may have a large number of entries 605 of stored data. TCAMs are frequently used in almost all types of computing devices and systems as a very fast device to access stored data. In a TCAM, entries can be matched to search keys of bit strings comprising 1, 0, or don't care (wildcard) bits. In some embodiments, system 600 may have a CAM in place of, or in addition to, TCAM 604. A CAM, in contrast to a TCAM, does not match search keys to memory entries having wildcard characters.

TCAM 604 takes as input a search key 603, and simultaneously compares the search key 603 to all or a subset of the entries 605. The matches, if any, are resolved by a match resolving unit 612, which operates to select the best match from matching TCAM entries.

TCAMs, as they are often used, are very high speed memories that are used to store a subset of the content of larger memories, such as system memory 632. Compared to system memory 632, TCAM 604 may be small because of the relatively high cost in terms of power consumption and implementation. However, TCAMs may have several thousand entries.

According to an embodiment, search key 603, is transmitted from a register 602 to TCAM 604 in order to perform the lookup. Specifically, search key 603 is simultaneously delivered to each of the entries 605 of TCAM 604. Search key 603 may be transferred between register 602 and TCAM 604 via a parallel bus 610.

Parallel bus 610 interconnects a transmitter 606, which accesses register 602, to receiver 608 which is coupled to TCAM 604. Parallel bus 610 has a plurality of lanes over which bits are transmitted in parallel. According to an embodiment, parallel bus 610 has 640 lanes. A different number of lanes can be used, as will be understood by those skilled in the arts.

In the 640-lanes parallel bus, 639 of the lanes are configured to carry respective bits of the search key 603. One lane is configured to carry the invert bit associated with the search key 603 that is being transmitted in accordance with an embodiment. Each lane 611 of parallel bus 610 extends from a transmit transceiver 642 in transmitter 606 to a receive transceiver 644 in receiver 606.

Transmitter 606, using modules such as bit string encoder 620 and transmit logic 616, operates to distribute search key 603 to TCAM 604. Bit string encoder 620 may operate to determine whether search key 603 is to be transmitted as an inverted bit string or as an un-inverted bit string. If it is determined to transmit the search key as an inverted bit string over bus 610, then bit string encoder 620 operates to invert the bit string and to associate an invert bit with the bit string. Likewise, when the bit string is to be transmitted in non-inverted form, then bit string encoder 620 may operate to prepare the bit string for transmission by associating an appropriate invert bit with the bit string. Transmit logic 616 operates to enable transmitter 606 to transmit a search key 603 to receiver 608 over parallel bus 610. According to an embodiment, transmit logic 606 operates to transmit search key 603 in the form generated by bit string encoder 620.

Receiver 608, using modules such as receive logic 618 and bit string decoder 622, operate to receive search key 603 over parallel bus 610. Receive logic 618 may be associated with receiver 608, and may operate to receive bit strings transmitted over parallel bus 610 by transmitter 606. Bit string decoder 622 may be associated with receiver 608, and may operate to decode the bit strings received by receive logic 618. Bit string decoder 622 may operate to determine whether or not a received bit string is an inverted bit string.

System 600 may also include a processor 614, a system memory 632, a persistent memory 634, and an interconnection infrastructure 636. Processor 614 may provide primary control for the operations in system 600, and may execute one or more applications and/or processes that cause memory accesses involving TCAM 604. Interconnecting infrastructure 636 includes one or more bus or other interconnections, and operates to interconnect components of system 600.

System memory 632 may be a dynamic random access memory (DRAM) or other form of volatile memory. In many embodiments, system memory 632 may be large when compared to TCAM 604. In some embodiments, TCAM 604 may be used to facilitate fast access to system memory 632.

Persistent memory 634 may include magnetic disk memory, flash memory, other form of non-volatile memory, or another computer readable storage medium. In some embodiments, persistent memory 634 may store instructions implementing at least portions of the logic associated with methods illustrated in FIGS. 1-5.

Figure 7:
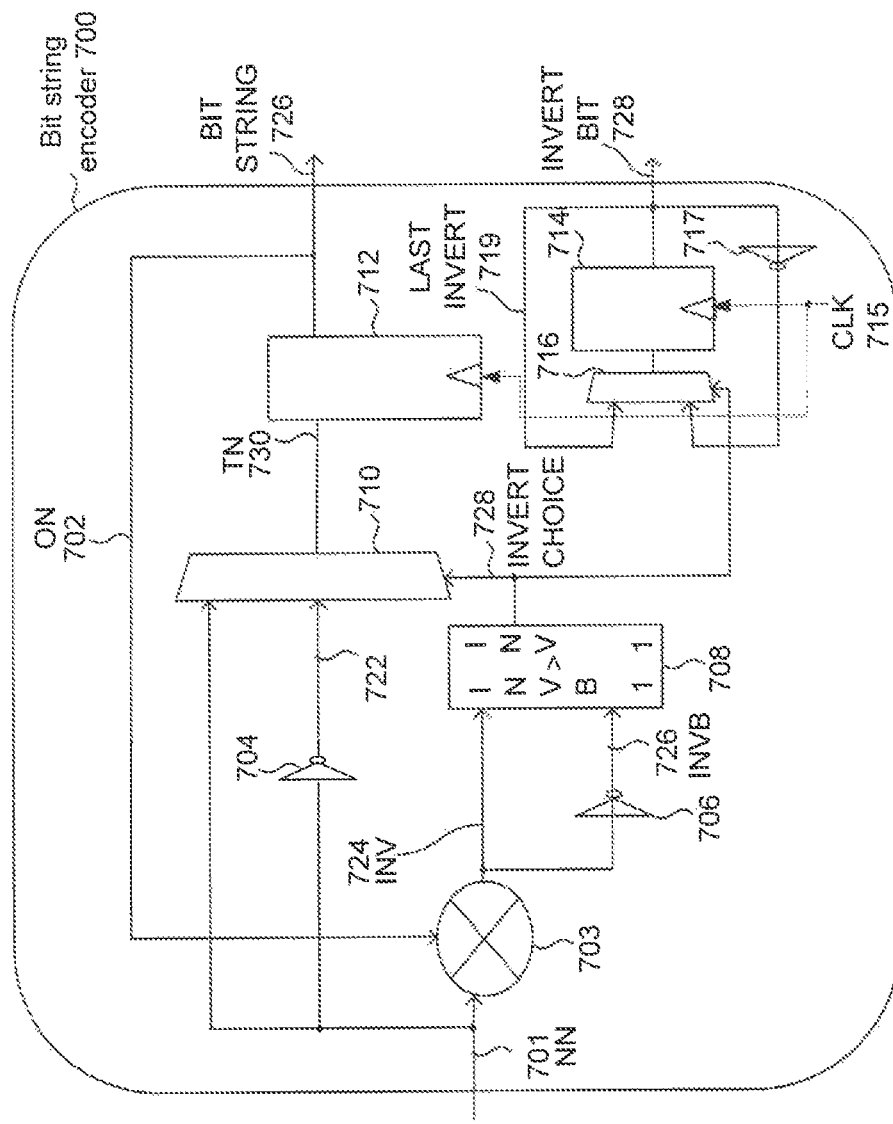
FIG. 7 illustrates a bit string encoder for a transmitter, in accordance with an embodiment.

FIG. 7 illustrates a bit string encoder 700 for a transmitter, in accordance with an embodiment. According to an embodiment, bit string encoder 700 may be used in system 600 (e.g. as bit string encoder 620).

Bit string encoder 700 takes as input a current bit string 701 (NN or "new number") bit-by-bit. Current bit string 701 is provided to XOR logic 703 and to multiplexor 710. XOR logic 703 operates to perform an exclusive OR of current bit string 701 and the immediately preceding bit string 702 (ON or "old number") in a bit-by-bit manner.

The output INV 724 of XOR logic 703 is input to an inverter 706. The output 726 from the inverter 706, and INV 724 are input to a comparator circuit 708. The comparator circuit 708 outputs an INVERT CHOICE 728. The INVERT CHOICE 728 is set to 1 if number of set bits in INVB>INV, and set to 0 otherwise. INVERT CHOICE 728 provides the control input to multiplexors MUX 716 and MUX 710. MUX 716 also receives the LAST INVERT BIT 719 and the inverted LAST INVERT BIT 719. The inversion of the LAST INVERT BIT 719 is performed by inverter 717. Based upon INVERT CHOICE 728, MUX 716 outputs either the LAST INVERT BIT 719 or the inverted LAST INVERT BIT 719 to delay circuit 714. Based upon the input received from MUX 716, INVERT BIT 728 may be transmitted from circuit 714 according to a clock input 715. INVERT BIT 728 is also provided as LAST INVERT BIT 719 to MUX 716.

In addition to the INVERT CHOICE 728, the current bit string 701 and the inverted current bit string 701 (the inverted current bit string 701 is shown as 722) are input to multiplexor MUX 710. The invert of the current bit string 701 is produced by inverter 704. MUX 710 outputs the transmit number "TN" 730. TN 730, output bit-by-bit from MUX 710, is held in circuit 712 to form a bit string. Output of circuit 712 is a bit string 726 to be transmitted. Bit string 726, is transmitted to a receiver over a parallel bus (not shown in FIG. 7). Bit string 726 is also used as ON 702 for use in determining the bit string to be transmitted next. The transmission from circuit 712 may be triggered by a clock input 715.

rIG. 8 illustrates a bit string decoder 800 for a receiver, in accordance with an embodiment. According to an embodiment, bit decoder 800 may be used in system 600 (e.g. as bit string decoder 622).

A TN 820 and INVERT BIT 821 are input to bit string decoder 800. INVERT BIT 821 is input to delay circuit 818 and to XOR logic 814. XOR logic 814 also takes the output 822 of delay circuit 818 as an input. The output 827 of XOR logic 814, TN 820, and output 823 of inverter 812 are input to MUX 808, where output 827 provides the control input. The output 823 of inverter 812 is the invert of TN 820. MUX 808 outputs either TN 820 or the invert of TN 820 based upon output 827 from XOR logic 814. The output 829 from MUX 808 is input to a delay circuit 804 which outputs receive data 802. The output of circuits 804 and 818 may be triggered by one or more clocks 815.

The representative functions of the communications device described herein may be implemented in hardware, software, or some combination thereof. For instance, processes 100, 200, 300, 400 and 500 can be implemented using computer processors, computer logic, ASIC, FPGA, DSP, etc., as will be understood by those skilled in the arts based on the discussion given herein. Accordingly, any processor that performs the processing functions described herein is within the scope and spirit of the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for communicating over a data bus, comprising:
    determining a number of changes in bit value in respective bit positions between a previous bit string and a current bit string:
    transmitting the entreat bit string over the data bus in one of an inverted form or a non-inverted form, wherein the inverted form is used for transmission if the determined number of changes in bit value exceeds a threshold, and wherein the non-inverted form is used for transmission if the determined number of changes in bit value does not exceed the threshold; and
    transmitting an additional bit along with the current bit string having a logic value that indicates whether the current bit string is transmitted in the inverted form or the non-inverted form,
    wherein the additional bit is set to an invert of a previous additional bit when the current bit string is transmitted in the inverted form or set to a same logic value as the previous additional bit if the current bit string is transmitted in the non-inverted form.

2. The method of claim 1, wherein the transmitting the current bit string comprises:
    forming a plurality of bit substrings, wherein each of the bit substrings is a respective substring of the current bit string; and
    transmitting the plurality of bit substrings, wherein at least one of the bit substrings is transmitted in the inverted form.

3. The method of claim 2, wherein the transmitting the additional bit along with the current bit string comprises:
    transmitting an additional bit along with each of the plurality of bit substrings indicating whether said each of the plurality of bit substrings is in the inverted form.

4. The method of claim 1, wherein the transmitting the current bit string comprises transmitting the current bit string from a first memory to a plurality of entries in a content accessible memory (CAM) over a parallel data bus.

5. The method of claim 4, wherein the current bit string and the previous bit string represent one or more search keys.

6. The method of claim 1, further comprising:
    transmitting the previous bit string over the data bus before the current bit string.

7. A method for communicating over a data bus, comprising:
    receiving a current bit string over the data bus along with an additional bit associated with the current bit string;
    determining, based upon a logic value of the received additional bit, whether the received current bit string is in an inverted form; and
    inverting the received current bit string if the received current bit string is in the inverted form according to the determining,
    wherein the current bit string is determined to be in the inverted form when the logic value of the received additional bit corresponds to an invert of a logic value of the previous additional bit, otherwise the current bit string is determined to be in a non-inverted form.

8. The method of claim 7, wherein the determining comprises:
    determining the logic value of the previous additional bit configured to indicate whether the previous bit string received over the data bus is in an inverted form or in a non-inverted form;
    detecting whether the received additional bit associated with the current bit string corresponds to an invert of the determined logic value of the previous additional bit.

9. A data transmitter, comprising:
    a data bus coupling a data source to ore or more data destinations;
    a bit string encoder configured to:
        determine a number of changes in bit value in respective bit positions between a previous bit string and a current bit string; and
    a transmitting module configured to:
        transmit the current bit string in an inverted form over the data bus if the determined number of changes in bit value exceeds a threshold, or transmit the current bit string in a non-inverted form if the determined number of changes in bit value does not exceed the threshold; and
        transmit an additional bit along with the current bit string having a logic value that indicates whether the current bit string is in the inverted form or the non-inverted form, wherein the additional bit is set to an invert of a previous additional bit when the current bit string is transmitted in the inverted form or set to a same logic value as the previous additional bit when the current bit string is transmitted in the non-inverted form.

10. The data transmitter of claim 9, wherein the data source is coupled to a plurality of data destinations by the data bus.

11. The data transmitter of claim 10, further comprising:
a content addressable memory (CAM), wherein the data source is a register file and the plurality of data destinations are respective entries in the CAM.

12. The data transmitter of claim 9, wherein the bit string encoder is further configured to:
invert the current bit string if the determined number of changes in bit value exceeds the threshold; and
associate the additional bit with the inverted current bit string.

13. The data transmitter of claim 9, wherein the bit string encoder is further configured to:
form a plurality of bit substrings, wherein each of the plurality of bit substrings is a respective substring of the current bit string;
invert at least one of the plurality of bit substrings; and
associate a respective additional bit with each of the plurality of bit substrings.

\* \* \* \* \*

UNITED STATES PATENT AND TRADEMARK OFFICE
CERTIFICATE OF CORRECTION

| | | |
|---|---|---|
| PATENT NO. | : 9,245,625 B2 | Page 1 of 1 |
| APPLICATION NO. | : 13/627590 | |
| DATED | : January 26, 2016 | |
| INVENTOR(S) | : Sachin Joshi | |

It is certified that error appears in the above-identified patent and that said Letters Patent is hereby corrected as shown below:

Specification

Figure 8:
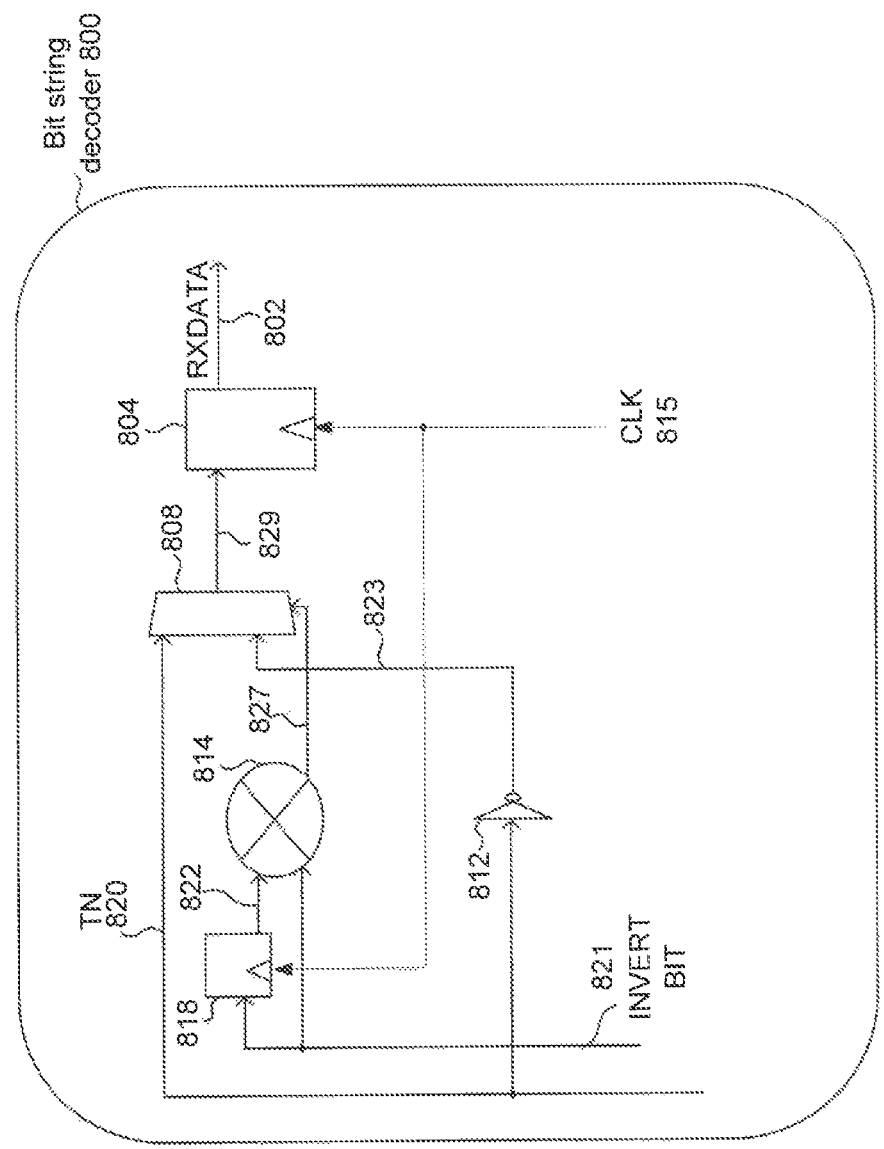
FIG. 8 illustrates a bit string decoder for a receiver, in accordance with an embodiment.

Column 8, Line 58. Please replace "rIG. 8" with --FIG. 8--.

Claims

Column 9, Line 55, claim 1. Please replace "the entreat bit" with --the current bit--.

Signed and Sealed this
Twenty-sixth Day of April, 2016

Michelle K. Lee
*Director of the United States Patent and Trademark Office*